United States Patent
Wan et al.

(10) Patent No.: US 11,945,893 B2
(45) Date of Patent: Apr. 2, 2024

(54) CURABLE COMPOSITION

(71) Applicant: CANON KABUSHIKI KAISHA, Tokyo (JP)

(72) Inventors: Fen Wan, Austin, TX (US); Weijun Liu, Cedar Park, TX (US); Gary F. Doyle, Round Rock, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 414 days.

(21) Appl. No.: 17/038,491

(22) Filed: Sep. 30, 2020

(65) Prior Publication Data

US 2022/0098345 A1     Mar. 31, 2022

(51) Int. Cl.

| | |
|---|---|
| *C08F 222/10* | (2006.01) |
| *B82Y 40/00* | (2011.01) |
| *C08F 2/50* | (2006.01) |
| *C08F 220/18* | (2006.01) |
| *C08F 236/20* | (2006.01) |
| *C08F 236/22* | (2006.01) |
| *G03F 7/00* | (2006.01) |

(52) U.S. Cl.
CPC .............. *C08F 222/10* (2013.01); *C08F 2/50* (2013.01); *C08F 220/1807* (2020.02); *C08F 220/1811* (2020.02); *C08F 236/20* (2013.01); *C08F 236/22* (2013.01); *G03F 7/0005* (2013.01); *B82Y 40/00* (2013.01)

(58) Field of Classification Search
CPC .............. C08F 222/10; C08F 220/1807; C08F 220/1811; C08F 236/22; C08F 236/20; C08F 2/50; G03F 7/0005; B82Y 40/00
USPC ....................................... 428/522
See application file for complete search history.

(56) References Cited

U.S. PATENT DOCUMENTS

| | | | |
|---|---|---|---|
| 5,910,392 A | 6/1999 | Nozaki | |
| 6,773,789 B2 | 8/2004 | Murayama | |
| 8,282,872 B2 | 10/2012 | Fujita | |
| 2007/0160937 A1 | 7/2007 | Ogino | |
| 2016/0377976 A1 | 12/2016 | Miyake | |

FOREIGN PATENT DOCUMENTS

| | | | | |
|---|---|---|---|---|
| EP | 1146394 A1 | 10/2001 | | |
| JP | 10-133377 A | 5/1998 | | |
| JP | 10133377 A | * 5/1998 | ........... | G03F 7/0045 |
| JP | H 10133377 A | * 5/1998 | | |
| JP | 2003-141713 A | 5/2003 | | |
| JP | 2003141713 A | * 5/2003 | ............... | B32B 3/00 |
| JP | 2005-166159 A | 6/2005 | | |
| JP | 2005166159 A | * 6/2005 | | |
| JP | 2005-350356 A | 12/2005 | | |
| JP | 2005350356 A | * 12/2005 | | |
| JP | 2006-003852 A | 1/2006 | | |
| JP | 2006003852 A | * 1/2006 | | |
| JP | 2006310565 A | 11/2006 | | |
| JP | 2007186570 A | 7/2007 | | |
| JP | 2009215179 A | 9/2009 | | |
| JP | 2010182758 A | 8/2010 | | |
| JP | 2012049152 A | 3/2012 | | |
| JP | WO10110121 A1 | 9/2012 | | |
| JP | 2015120879 A | 7/2015 | | |

OTHER PUBLICATIONS

Dry Etch Resistance of Organic Materials H. Gokan, S. Esho, and Y. Ohnishi, J. Electrochem. Soc. 130, 143 (1983).
Limits to Etch Resistance for 193-nm Single-Layer Resists R. R. Kunz, S. C. Palmateer, and A. R. Forte, Proc. SPIE 2724, 365 (1996)., S. C. Palmateer, and A. R. Forte, Proc. SPIE 2724, 365 (1996).
Etch resistance: comparison and development of etch rate models Proc. of SPIE vol. 6519, 651912, (2007).
Chlorine-Based Dry Etching of 111/V Compound Semiconductors for Optoelectronic Application, Jpn. J. Appl. Phys. vol. 37 (1998) pp. 373-387.
Study of Dry Etching Resistance of Methacrylate Polymers for ArF Excimer Laser Lithography SPIE vol. 3333 / 595.

* cited by examiner

*Primary Examiner* — Michael M. Bernshteyn
(74) *Attorney, Agent, or Firm* — Abel Schillinger, LLP

(57) ABSTRACT

A curable composition can comprise a polymerizable material including a monomer of Formula (1), with R being H or alkyl or alkylaryl, n being 1-4, m being 0-6, $X_1$ being $C_1$-$C_6$ substituted or unsubstituted alkyl, $X_2$ being $CH_3$ or H, (1)

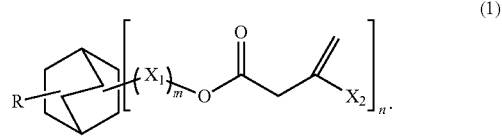

After forming a cured layer of the curable composition, the cured layer can have an excellent etch resistance.

16 Claims, No Drawings

CURABLE COMPOSITION

FIELD OF THE DISCLOSURE

The present disclosure relates to a curable composition, particularly to a curable composition for use in nanoimprint lithography.

BACKGROUND

Nanoimprint lithography is a useful method to manufacture nano-sized features onto a target substrate. In a first step, the pattern of a template is transferred to a cured resist, and in a second step the pattern of the cured resist is transferred to the underlying layer. The second step is typically conducted by etching and called pattern transfer.

A good pattern transfer can be achieved if the etch layer is removed without damage to the resist pattern layer, which requires that the imprint resist has a high etch resistance. Next to a high etch resistance, an imprint resist composition needs to have a low viscosity, a suitable surface tension, and a low contact angle to the underlying substrate.

There exists a need to improve the etch resistance of cured resist materials to form high precision patterns.

SUMMARY

In one embodiment, a curable composition can comprise a polymerizable material including a monomer of Formula (1)

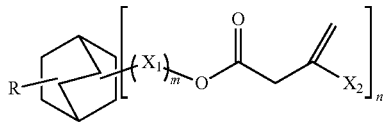

with R being H or alkyl or alkylaryl, n being 1-4, m being 0-6, $X_1$ being $C_1$-$C_6$ substituted or unsubstituted alkyl, $X_2$ being $CH_3$ or H.

In one aspect, the monomer of Formula (1) can include a di-functional acrylate monomer.

In a certain aspect, the di-functional acrylate monomer may include a structure of Formula (2)

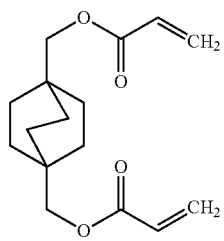

In another aspect of the curable composition, an amount of the monomer of Formula (1) can be at least 5 wt % and not greater than 50 wt % based on the total weight of the curable composition.

In a further aspect, an amount of the polymerizable material can be at least 5 wt % and not greater than 98 wt % based on the total weight of the curable composition.

In another embodiment of the curable composition, the polymerizable material can comprise at least one second acrylate monomer different from the monomer of Formula (1).

In a certain aspect, the at least one second acrylate monomer can include benzyl acrylate (BA), or isobornyl acrylate (IBOA), neopentyl glycol diacrylate (A-NPG), or any combination thereof.

In one embodiment, the curable composition can have a viscosity of not greater than 20 mPa·s. In a particular aspect, the curable composition may have a viscosity not greater than 15 mPa·s.

In a further embodiment, the curable composition can be adapted for use as a resist in a nanoimprint lithographic process.

In a certain aspect, an Ohnishi number of the curable composition after curing may be not greater than 3.6.

In another embodiment, a laminate can comprise a substrate and a cured layer overlying the substrate, wherein the cured layer can be formed from the above described curable composition of the present disclosure.

In one aspect, the cured layer of the laminate can have an Ohnishi number of not greater than 3.6.

In another embodiment, a method of forming a cured layer on a substrate can comprise applying a curable composition on the substrate, wherein the curable composition may comprise a polymerizable material including a monomer having a structure of Formula (1),

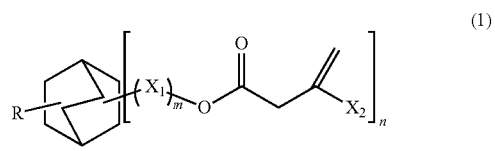

with R being H or alkyl or alkylaryl, n being 1-4, m being 0-6, $X_1$ being substituted or unsubstituted $C_1$-$C_6$ alkyl, $X_2$ being $CH_3$ or H; bringing the curable composition into contact with a superstrate; curing the curable composition with light and/or heat to form a cured layer; and removing the superstrate from the photo-cured layer.

In one aspect of the method, a viscosity of the curable composition may be not greater than 15 mPa·s.

In another aspect of the method, the amount of the monomer of Formula (1) can be at least 5 wt % and not greater than 50 wt % based on the total weight of the curable composition.

In a further aspect of the method, the monomer of Formula (1) can include a structure of Formula (2)

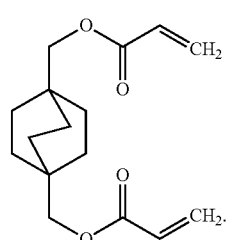

In another embodiment, a method of manufacturing an article can comprise: applying a curable composition on a substrate, wherein the curable composition can comprise a polymerizable material including a monomer having a structure of Formula (1),

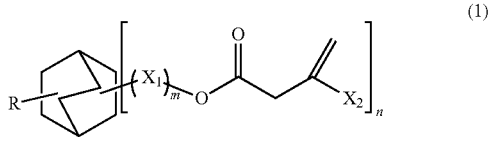

with R being H or alkyl or alkylaryl, n being 1-4, m being 0-6, $X_1$ being substituted or unsubstituted $C_1$-$C_6$ alkyl, $X_2$ being $CH_3$ or H; bringing the curable composition into contact with a superstate; curing the curable composition with light and/or heat to form a cured layer; and removing the superstate from the cured layer; and processing the substrate with the photo-cured layer to make the article.

In one aspect of the method of manufacturing an article, an amount of the monomer of Formula (1) can be at least 5 wt % and not greater than 50 wt % based on the total weight of the curable composition, and a viscosity of the curable composition may be not greater than 15 mPa·s.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a curable composition comprising a polymerizable material including an acrylate monomer comprising a bicyclooctane ring structure, herein also called "bicyclooctane acrylate monomer." It has been surprisingly observed that curable compositions containing a bicyclooctane acrylate monomer can have an excellent etch resistance after curing, and may be suitable as nanoimprint resist materials allowing a high precision pattern transfer.

In one embodiment, the curable composition of the present disclosure can comprise a bicyclooctane acrylate monomer of Formula (1)

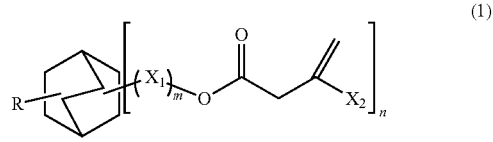

with R being H or alkyl or alkylaryl, n being 1-4, m being 0-6, $X_1$ being $C_1$-$C_6$ substituted or unsubstituted alkyl, $X_2$ being $CH_3$ or H.

In a particular embodiment, the monomer of Formula (1) can be a di-functional acrylate monomer. In a certain aspect, the di-functional acrylate monomer can have the structure of Formula 2:

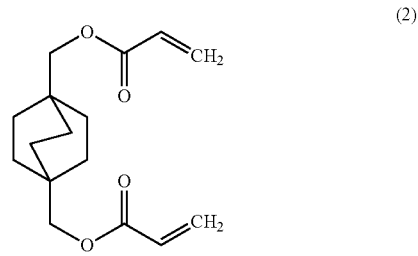 [SMILES: C=CC(=O)OCC12CCC(COC(=O)C=C)(CC1)CC2]

The amount of the monomer of Formula (1) of the curable composition can be at least 5 wt % based on the total weight of the curable composition, such as at least 10 wt %, or at least 15 wt %, or at least 20 wt %. In another aspect, the amount of the monomer of Formula (1) may be not greater than 50 wt %, or not greater than 40 wt %, or not greater than 30 wt % based on the total weight of the curable composition.

The polymerizable material can include next to the monomer of Formula (1) other polymerizable monomers, oligomers and/or polymers. In one embodiment, the polymerizable material can include at least one second acrylate monomer which does not contain a bicyclooctane ring structure like the monomer of Formula 1. The at least one second acrylate monomer can be a mono-functional or a multi-functional acrylate monomer. In a certain particular aspect, the at least one second acrylate monomer can include benzyl acrylate (BA), isobornyl acrylate (IBOA), neopentyl glycol diacrylate (A-NPG), or any combination thereof.

An amount of the at least one second acrylate monomer can be at least 15 wt % based on the total weight of the curable composition, such as at least 20 wt %, or at least 25 wt %, or at least 30 wt %, or at least 50 wt %. In another aspect, the at least one second acrylate monomer may be not greater than 90 wt % based on the total weight of the curable composition, such as not greater than 80 wt %, not greater than 60 wt %, or not greater than 40 wt %.

The polymerizable material may be the majority amount the curable composition. In one embodiment, the amount of the polymerizable material can be at least 80 wt % based on the total weight of the curable composition, or at least 90 wt %, or at least 95 wt %, or at least 97 wt %. In another aspect, the amount of polymerizable material may be not greater than 99 wt %, or not greater than 97 wt %, or not greater than 95 wt %.

In one embodiment, the curable composition can be adapted having a low viscosity, which can make the composition suitable for use as resist in nanoimprint lithography. In one aspect, the viscosity of the curable composition can be not greater than 20 mPa·s, such as not greater than 15 mPa·s, not greater than 12 mPa·s, or not greater than 10 mPa·s, or not greater than 8 mPa·s. In another aspect, the viscosity can be at least 3 mPa·s, or at least 5 mPa·s, or at least 7 mPa·s. The viscosity can be a value between any of the upper and lower values cited above. As used herein, all viscosity values relate to viscosities measured at a temperature of 23° C. with the Brookfield method.

In a further aspect, the curable composition of the present disclosure may be free of a solvent, and the at least one first monomer of Formula (1) can be dissolved in the at least one second acrylate monomer.

In order to initiate the curing of the curable composition if exposed to light, one or more photo-initiators can be included in the curable composition. Non-limiting examples of photo-initiators can be, for example, Irgacure 819, Irgacure 651, Irgacure 1173, Irgacure 2959, Irgacure 4265, or Irgacure TPO.

In a further aspect, the curable composition can contain at least one optional additive. Non-limiting examples of an optional additive can be a release agent, a surfactant, a dispersant, a stabilizer, a co-solvent, an initiator, an inhibitor, a dye, or any combination thereof. In a certain particular aspect, the curable composition can consist essentially of the polymerizable material including a monomer of Formula (1), a photo initiator and/or thermal initiator, and an optional release agent.

In another embodiment of the present disclosure, a laminate can comprise a substrate and a cured layer overlying the substrate, wherein the cured layer may be formed from the curable composition described in the embodiments above. The substrate is not limited to a specific material. In a particular certain aspect, the substrate can be a fused silica, quartz, silicon, an organic polymer, a siloxane polymer, a borosilicate glass, a fluorocarbon polymer, metal, hardened sapphire, and/or the like.

In one aspect, the cured layer of the laminate can have an Ohnishi number of not greater than 3.6, such as not greater than 3.5, or not greater than 3.45. As used herein, the Ohnishi number is an empirical parameter and calculated as the ratio of total number of atoms (Nt) in the polymer repeat unit divided by the difference between the number of carbon atoms (Nc) and oxygen atoms (NO) in the unit, ON=Nt/(NC−NO). For the calculation of the Ohnishi number, it was assumed that the cured materials contained 100 wt % of the polymerized monomer units formed by addition polymerization (no loss of atoms during polymerizations).

In another aspect, a thickness of the cured layer within the laminate can be at least 80 nm, or at least 100 nm, or at least 200 nm. In a further aspect, the thickness of the photo-cured layer may be not greater than 2000 nm, or not greater than 1000 nm, or not greater than 500 nm.

In a certain aspect, the laminate can include one or more layers between the substrate and the cured layer, for example an adhesion layer.

If subjected to etching, for example dry etching with a chlorine containing gas, the cured layer can have an excellent etch resistance. This makes the curable compositions of the present invention very suitable for use as resist materials in nanoimprint lithography.

The present disclosure is further directed to a method of forming a cured layer on a substrate. The method can comprise applying the curable composition described above over a substrate; bringing the curable composition into contact with a superstrate; curing the curable composition with light and/or heat to form the cured layer; and removing the superstrate from the cured layer.

In one aspect, the light irradiation can be conducted with light having wavelength between 250 nm to 760 nm. In a preferred aspect, the light irradiation may be conducted with light having a wavelength between 300 nm and 450 nm.

The substrate and the solidified (cured) layer may be subjected to additional processing to form a desired article, for example, by including an etching process to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles (devices).

The cured layer may be further used as an interlayer insulating film of a semiconductor device, such as LSI, system LSI, DRAM, SDRAM, RDRAM, or D-RDRAM, or as a resist film used in a semiconductor manufacturing process.

As further demonstrated in the examples, it has been surprisingly discovered that a curable composition including a monomer of Formula 1 can have an excellent etch resistance after curing. The curable composition can further have a low viscosity of not greater than 15 xxx, which makes the curable composition of the present disclosure suitable for processes involving nanoimprint lithography.

EXAMPLES

The following non-limiting examples illustrate the concepts as described herein.

Example 1

Preparing of the Bicyclooctane Acrylate Monomer of Formula 2.

An amount of 25 g (1 mol equivalent) bicyclo[2.2.2]octane-1,4-dimethanol (BCO-DM) was dissolved in 200 ml dichloromethane containing 25.5 g (1.7 mol equivalent) triethylamine. The obtained solution was placed in an ice bath and cooled down to 0° C. Thereafter, 20.3 g (1.5 mol equivalent) acryloyl chloride dissolved in 50 ml dichloromethane was slowly dropped under nitrogen atmosphere and stirring into the BCO-DM containing solution. After adding the acryloyl chloride, the temperature of the reaction solution was maintained for 1 hour at 0° C. Thereafter, the ice bath was removed, and the reaction mixture was stirred for further 24 hours under nitrogen. The obtained white reaction product was the monomer of Formula 2, herein also called bicyclo[2.2.2]octane-1,4-dimethylacrylate (BCO-DA). The reaction product was separated by filtration and washed with distilled water. The reaction yield was 80%.

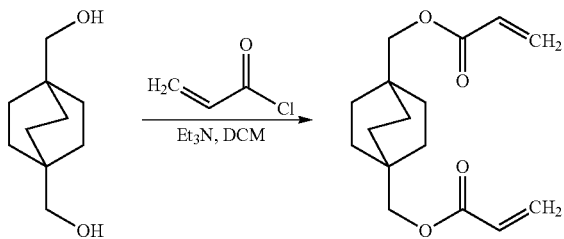

Example 2

A curable composition (Sample 1) was prepared including 20 wt % of bi-cyclooctane diacrylate of Formula 2 (BCO-DA), 35 wt % BA, 10 wt % IBOA, and 50 wt % A-NPG. The composition further contained 2 wt % of photo-initiator Irgacure TPO, 3 wt % of Irgacure 4265, and 3 wt % of release agents FS2000M2 and FS2000M1 (from Daniel Lab). The final composition had a viscosity of 6.5 mPa·s at 23° C.

Furthermore, a comparative curable composition (Sample 2) was prepared having a similar composition as Sample 1, except that it did not including BCO-DA and had a higher amount of A-NPG. The viscosity of comparative Sample S2 was 6.0 mPa s at 23° C.

Cured layers of each composition were made by applying a 100 nm thick liquid film of the curable composition on a silicon substrate and exposing the liquid films to UV radiation until they were fully cured.

The etch resistance of the photocured layers was tested according to two different etching processes: 1) $Cl_2/O_2$ etching, and 2) $O_2/Ar$ etching.

As summarized in Table 1, Sample 1 (which included BCO-DA) had a higher etch resistance (which corresponds to a lower etch-rate) in comparison to Sample 2 during both etching processes, i.e., $Cl_2/O_2$ etching, as well as $O_2/Ar$ etching. The etch resistance was the highest under $Cl_2/O_2$ etching. The data of the etch resistance shown in Table 1 are normalized data, wherein the actually measured etch-rate of the sample with the highest etch-rate (Sample 2) was set to 1, and the corresponding normalized etch rate for Sample S1 was calculated based thereon.

Measuring the Etch Resistance 100 nm thick films of the curable composition were deposited on a silicon wafer. The liquid films were fully cured by subjecting the films to a UV light intensity of 20 mW/cm$^2$ and curing them for 120 seconds, which corresponded to a curing energy dosage of 2.4 J/cm$^2$.

A plurality of films from Sample 1 and Sample 2 were placed on the same wafer in a checker-board pattern, such that the films of the two samples were placed in alternating order. Each checker board contained five films of each tested sample.

After curing of the sample films, the checker-board was placed in a Trion Oracle 3-Chamber Cluster System to expose the films to the selected dry etch conditions. The Trion Oracle 3-Chamber Cluster System is a dry etch tool having three separate process chambers, each chamber being connected to a central load-lock chamber containing access to the gases $Cl_2$, $O_2$, $CF_4$, and argon.

The $Cl_2/O_2$ etching was conducted under the following conditions: $Cl_2$=54 sccm, $O_2$=9 sccm, RIE (reactive ion etching)=90 w, P (pressure)=150 mt, ET (etching time)= 90 s.

The $O_2/Ar$ etching was conducted as following: $O_2$=2 sccm, Ar=10 sccm, RIE=45 w, P=10 mt, ET=45 s.

The amount of material removed during the etching at a defined etching time (etch-rate) was measured via reflectometry, and expressed in nm. For comparison purposes of the data, the measured etch-rates were converted to normalized etch-rates by setting the sample having the highest etch-rate of the tested samples to a number of 1, and calculating the related number (normalized etch rate) of the other sample.

Measuring of the Viscosity

The viscosity was measured for each sample at 23° C., using a Brookfield Viscometer LVDV-II+Pro at 200 rpm, with a spindle size #18. For the viscosity testing, about 6-7 mL of sample liquid was added into the sample chamber, enough to cover the spindle head. For all viscosity testing, at least three measurements were conducted and an average value was calculated.

Example 3

A curable composition (Sample S3) was prepared similar as Sample S1 in Example 2, except that the amount of BCO-DA was 5 wt %, and further contained DCP-A/DA (a mixture of dicyclopentyl acrylate and dicyclopentyl diacrylate). The viscosity of Sample S3 was 7.11 mPa·s. Cured films of Sample S3 were compared with cured films from comparative composition Sample S4. Comparative composition S4 did not contain BCO-DA. The viscosity of sample S4 was 7.15 mPa·s. The exact compositions of Samples S3 and S4 are summarized in Table 2.

TABLE 1

| Sample | BCO-DA | BA | IBOA | A-NPG | Initiator/release agents | Normalized Etch-Rate $Cl_2/O_2$ | Normalized Etch Rate $O_2/Ar$ | Ohnishi Number |
|---|---|---|---|---|---|---|---|---|
| 1 | 20 | 35 | 10 | 30 | 5 | 0.949 | 0.961 | 3.44 |
| 2 | — | 35 | 10 | 50 | 5 | 1 | 1 | 3.62 |

TABLE 2

| BCO-DA | BA | IBOA | A-NPG | DCP-A/DA | Initiator/release agents | Norm Etch-Rate $Cl_2O_2$ | Norm Etch Rate $O_2$/Ar | Ohnishi Number |
|---|---|---|---|---|---|---|---|---|
| 3 | 5 | 37 | 32 | 5 | 20 | 7 | 0.929 | 0.947 | 3.16 |
| 4 | 0 | 24 | 36 | 20 | 21 | 7 | 1 | 1 | 3.14 |

As further summarized in Table 2, the normalized etch-rate of Sample S3 was lower than the normalized etch-rate for Sample S4, which means the etch resistance of Sample S3 was higher than for comparative Sample 4. Similar like for Sample S1, the best etch resistance of Sample S3 was obtained under dry chlorine etching conditions.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any sub combination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A curable composition comprising:
a polymerizable material consisting essentially of a monomer of Formula (1):

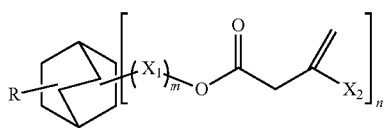

(1)

wherein R is H or alkyl or alkylaryl, n being 1-4, m is 0-6, $X_1$ is $C_1$-$C_6$ alkyl, $X_2$ is $CH_3$ or H; and
at least one second acrylate monomer different from the monomer of Formula (1),
wherein
an amount of the monomer of Formula (1) is at least 5 wt % and not greater than 30 wt % based on the total weight of the curable composition;
an amount of the at least one second monomer is at least 50 wt % based on the total weight of the curable composition; and
a viscosity of the curable composition is not greater than 20 mPa s.

2. The curable composition of claim 1, wherein the monomer of Formula (1) includes a di-functional acrylate monomer.

3. The curable composition of claim 2, wherein the di-functional acrylate monomer includes a structure of Formula (2):

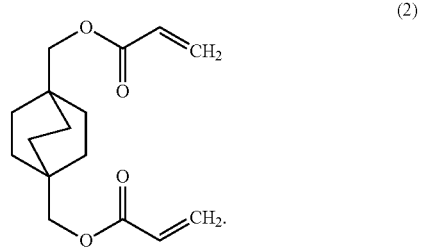 [SMILES: C=CC(=O)OCC12CCC(COC(=O)C=C)(CC1)CC2]

(2)

4. The curable composition of claim 1, wherein an amount of the polymerizable material is at least 80 wt % and not greater than 98 wt % based on the total weight of the curable composition.

5. The curable composition of claim 1, wherein the at least one second acrylate monomer is selected from the group consisting of benzyl acrylate (BA), or isobornyl acrylate (IBOA), or neopentyl glycol diacrylate (A-NPG), and any combination thereof.

6. The curable composition of claim 1, wherein the composition has a viscosity not greater than 15 mPa s.

7. The curable composition of claim 1, further comprising a photo-initiator.

8. The curable composition of claim 1, wherein the curable composition is adapted for use as a resist in a nanoimprint lithographic process.

9. The curable composition of claim 1, wherein an Ohnishi number of the curable composition after curing is not greater than 3.6.

10. A laminate comprising a substrate and a cured layer overlying the substrate, wherein the cured layer is formed from the curable composition of claim 1.

11. The laminate of claim 10, wherein the cured layer has an Ohnishi number of not greater than 3.6.

12. A method of forming a cured layer on a substrate, comprising:
applying a curable composition on a substrate, wherein the curable composition comprises a polymerizable material including a monomer having a structure of Formula (1):

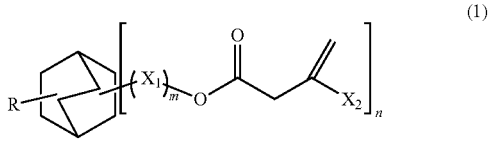

(1)

wherein R is H or alkyl or alkylaryl, n is 1-4, m is 0-6, $X_1$ is $C_1$-$C_6$ alkyl, $X_2$ is $CH_3$ or H; and at least one second acrylate monomer different from the monomer of Formula (1), wherein an amount of the monomer of Formula (1) is at least 5 wt % and not greater than 30 wt % based on the total weight of the curable composition, an amount of the at least one second monomer is at least 50 wt % based on the total weight of the curable composition, and a viscosity of the curable composition is not greater than 20 mPa s;

bringing the curable composition into contact with a superstrate;

curing the curable composition with light and/or heat to form a cured layer; and removing the superstrate from the cured layer.

13. The method of claim 12, wherein a viscosity of the curable composition is not greater than 15 mPa s.

14. The method of claim 12, wherein the monomer of Formula (1) includes a structure of Formula (2)

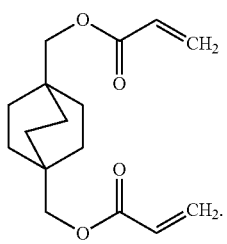

(2)

15. A method of manufacturing an article, comprising:
applying a curable composition on a substrate, wherein the curable composition comprises a polymerizable material including a monomer having a structure of Formula (1):

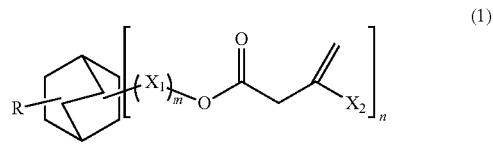

(1)

wherein R is H or alkyl or alkylaryl, n is 1-4, m is 0-6, $X_1$ is $C_1$-$C_6$ alkyl, $X_2$ is $CH_3$ or H; and at least one second acrylate monomer different from the monomer of Formula (1), wherein an amount of the monomer of Formula (1) is at least 5 wt % and not greater than 30 wt % based on the total weight of the curable composition, an amount of the at least one second monomer is at least 50 wt % based on the total weight of the curable composition, and a viscosity of the curable composition is not greater than 20 mPa s;

bringing the curable composition into contact with a superstrate;

curing the curable composition with light and/or heat to form a cured layer; and removing the superstrate from the cured layer;

removing the superstrate from the photo-cured layer; and processing the substrate with the photo-cured layer to make the article.

16. The method of claim 15, wherein the viscosity of the curable composition is not greater than 15 mPa·s.

* * * * *